United States Patent
Amano et al.

(10) Patent No.: US 6,977,545 B2
(45) Date of Patent: Dec. 20, 2005

(54) FM SIGNAL RECEIVER AND WIRELESS COMMUNICATIONS DEVICE USING SAME

(75) Inventors: Shinji Amano, Nara (JP); Yusuke Kishino, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 65 days.

(21) Appl. No.: 10/808,472

(22) Filed: Mar. 25, 2004

(65) Prior Publication Data

US 2004/0201415 A1 Oct. 14, 2004

(30) Foreign Application Priority Data

Apr. 14, 2003 (JP) ............................... 2003-109247

(51) Int. Cl.[7] ........................... H03D 3/00; H03K 9/06; H04B 1/16
(52) U.S. Cl. ..................... 329/318; 329/300; 329/319; 375/322; 455/205; 455/268; 455/334; 455/339; 455/340; 455/341
(58) Field of Search ................................ 329/300, 302, 329/315, 318, 319; 375/316, 322, 324, 334; 455/205, 214, 230–231, 268, 337, 338–341

(56) References Cited

U.S. PATENT DOCUMENTS

| 6,188,275 B1 * | 2/2001 | Mattisson et al. .......... 329/311 |
| 6,850,113 B2 * | 2/2005 | Amano ....................... 329/315 |
| 2002/0135418 A1 | 9/2002 | Amano |

FOREIGN PATENT DOCUMENTS

JP 7-115328 A 5/1995

* cited by examiner

*Primary Examiner*—David Mis
(74) *Attorney, Agent, or Firm*—Birch, Stewart, Kolasch & Birch, LLP (57) ABSTRACT

An FM signal receiver for use in receiving a burst signals as in a Bluetooth system includes a BPF and a frequency-demodulation circuit, each having, for example, a phase shifter, which is constructed from similar or related circuitry so as to enable adjustment of the frequency characteristics of the BPF and frequency-demodulation circuit through an identical control signal. A short-circuit switch is disposed linking the input and output terminals of an amplifier. A control circuit opens the switch in a receiving operation and closes the switch in an adjusting operation. Thus, adjustment is carried out without using the amplifier. Therefore, an amplifier offset does not affect the frequency-to-voltage conversion by the frequency-demodulation circuit in the adjusting of the frequency-demodulation circuit and similar adjusting of the BPF. Thus, the BPF is prevented from being incorrectly adjusted due to the offset. The BPF characteristics are suitably adjusted.

15 Claims, 9 Drawing Sheets

FM SIGNAL RECEIVER AND WIRELESS COMMUNICATIONS DEVICE USING SAME

This Nonprovisional application claims priority under 35 U.S.C. § 119(a) on Patent Application No. No. 2003-109247 filed in Japan on Apr. 14, 2003, the entire contents of which are hereby incorporated by reference.

FIELD OF THE INVENTION

The present invention relates in general to frequency modulation (FM) signal receivers suitably used for the reception of burst signals as in a Bluetooth system and to wireless communications devices based on those receivers, and in particular to the receivers and devices which automatically adjust, for every reception of a burst signal, the characteristics of a built-in bandpass filter and frequency-demodulation circuit in a wireless communications integrated circuit in order to achieve stable reception performance without adjustment.

BACKGROUND OF THE INVENTION

Bluetooth systems and other wireless device-to-device communications electronics are integrated onto a single chip for reduced cost and package volume. Integration of a frequency-demodulation circuit and filter circuit results in rather poor absolute precision in, for example, resistance and capacitance values, in the integrated circuit. Therefore, demodulation sensitivity and frequency characteristics, among others, may differ from one integrated circuit to the other. This is because the frequency characteristics of the phase shifter, the filter circuit, and other components for use in a frequency-demodulation circuit are typically dictated by the product of the resistance value of the resistor and the capacitance value of the capacitor constituting those components. The discrepancy changes primarily depending on irregularities in the resistance and capacitance values and to a much lesser degree, on temperature, power supply voltage, and other operating conditions.

Accordingly, Bluetooth systems and like wireless communications devices supposed to receive burst signals are automatically adapted to adjust operation of the bandpass filter and frequency-demodulation circuit immediately before reception and maintain the resultant state during the reception, in order to achieve stable reception performance without adjustment. The reception lasts for a short period of time (a single packet is received in a few hundred microseconds), and it is safely assumed that during that period, the characteristics do not change substantially.

A well known technique to eliminate the characteristics discrepancy between integrated circuits is disclosed in Japanese published unexamined patent application 7-115328/1995 (Tokukaihei 7-115328; published on May 2, 1995). According to this prior art, there is provided a control circuit to a frequency-demodulation circuit composed of a phase shifter and a phase comparator, the control circuit controlling the characteristics of the phase shifter to stabilize demodulation sensitivity.

Although capable of eliminating characteristics discrepancy caused by the absolute precision of elements in the integrated circuit, the prior art is short of eliminating those caused by the relative precision of the elements. Also, the control circuit requires a reference circuit for adjustment which is structured similarly to the phase shifter and the phase comparator. This adds to circuit complexity, raising new problems.

Figure 8:
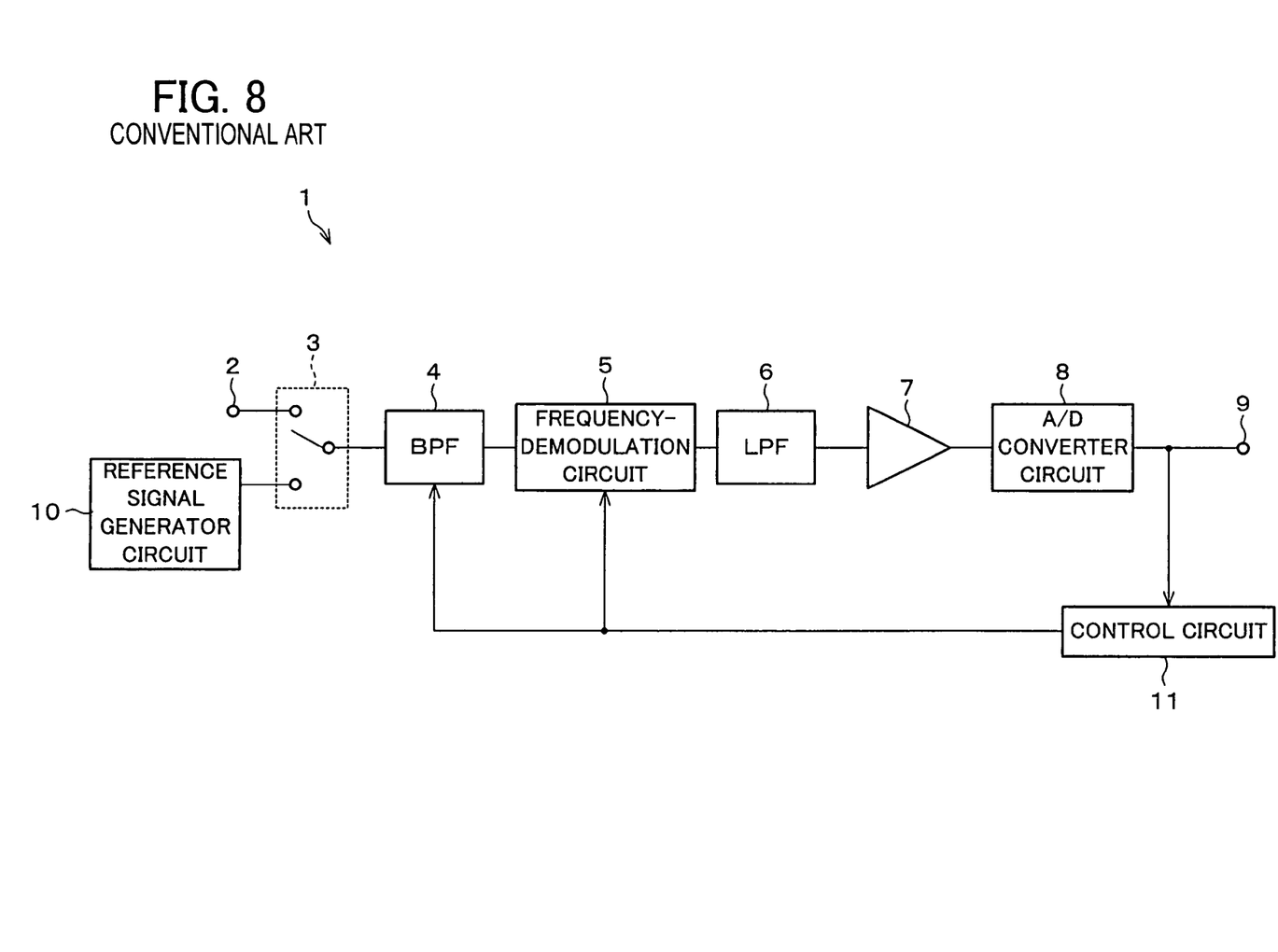
FIG. 8 is a block diagram showing an electrical construction of a typical conventional art FM signal receiver.

In the same context, U.S. patent application US-2002-0135418 published on Sep. 26, 2002, which constitutes prior art, proposes a technique to eliminate the characteristics discrepancy caused by the relative precision without significantly adding circuit complexity. FIG. 8 is a block diagram showing an electrical construction of an FM signal receiver 1 according to the prior art document. An FM signal received at an antenna (not shown) enters the receiver 1 through an input terminal 2 and travels past a switch 3. The signal is then filtered off by the bandpass filter (BPF) 4 to produce a signal composed of only components in the bandwidth targeted in reception. The resultant signal is fed to a frequency-demodulation circuit 5. The frequency-demodulation circuit 5 is constructed from a F-V converter circuit. The demodulated signal is filtered by a low pass filter (LPF) 6 and amplified by an amplifier 7. The signal is then converted to digital in an analog-to-digital converter circuit 8 and supplied out from an output terminal 9 to, for example, a subsequent decoder circuit (not shown).

Attention should be paid to the provision of a reference signal generator circuit 10 and a control circuit 11 in the FM signal receiver 1 for the purposes of, as mentioned above, eliminating characteristics discrepancy due to relative precision without significantly adding circuit complexity. The circuit 10 is coupled with the switch 3. The control circuit 11 adjusts the characteristics of the BPF 4 and frequency-demodulation circuit 5. A phase shifter in the frequency-demodulation circuit 5 is constructed from circuitry similar or related to the BPF 4.

On every reception of a burst signal, the control circuit 11 operates the switch 3 to connect the reference signal generator circuit 10 and controls the phase shifter in the frequency-demodulation circuit 5 so that the output of the frequency-demodulation circuit 5 has a specified value. The circuit 11 controls the BPF 4 similarly. The switch 3 is then connected back to the input terminal 2, while the control circuit 11 maintains the characteristics of the BPF 4 and frequency-demodulation circuit 5 in the same controlled state. Thus, the control circuit 11 stabilizes the characteristics of the BPF 4 and frequency-demodulation circuit 5 in reception. By automatically adjusting the characteristics of the BPF 4 and frequency-demodulation circuit 5 in response to every reception of a burst signal in this manner, the integrated circuit becomes stable without adjustment.

However, problems do exist with the FM signal receiver 1 constructed as above: when the BPF 4 is adjusted in response to the automatic adjustment of the characteristics of the frequency-demodulation circuit 5, an offset error of the amplifier 7 between the frequency-demodulation circuit 5 and the control circuit 11 keeps the characteristics of the BPF 4 from being suitably adjusted even if the characteristics of the frequency-demodulation circuit 5 are appropriately adjusted. This in turn develops frequency characteristics discrepancy in the BPF 4, degrading the characteristics of the entire receiver system.

To be more specific, the amplifier 7 is provided to render the amplitude of the output signal from the frequency-demodulation circuit 5 to such a level that is suited to the input dynamic range for the analog-to-digital converter circuit 8. Suppose that when the amplifier 7 is free from offset, the characteristics of the frequency-demodulation circuit 5 and amplifier 7 connected in series are such that represented in FIG. 9(a). If so, when the amplifier 7 has a $\Delta V$ offset, the characteristics are such that represented in FIG. 9(b). As mentioned earlier, the frequency-demodulation circuit 5 is constructed from a F-V converter circuit. Let f0 be a reference signal frequency and V0 be a specified value, which serves as a reference, when the frequency-demodulation circuit 5 is controlled by the control circuit 11. When the amplifier 7 has no offset, the characteristics of the frequency-demodulation circuit 5 are controlled by the control circuit 11 so that they are represented by the solid line in FIG. 9(a). The BPF 4 is accordingly controlled as shown by the solid line in FIG. 10(a).

Figure 9:
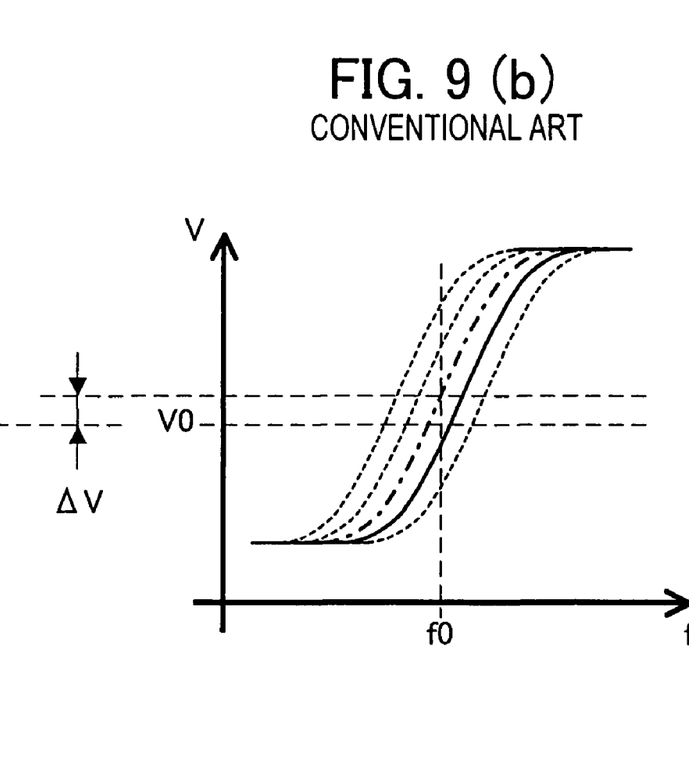
FIGS. 9(a) and 9(b) are graphs showing characteristics of a frequency-demodulation circuit, illustrating the offset of the amplifier in an FM signal receiver.
Figure 10:
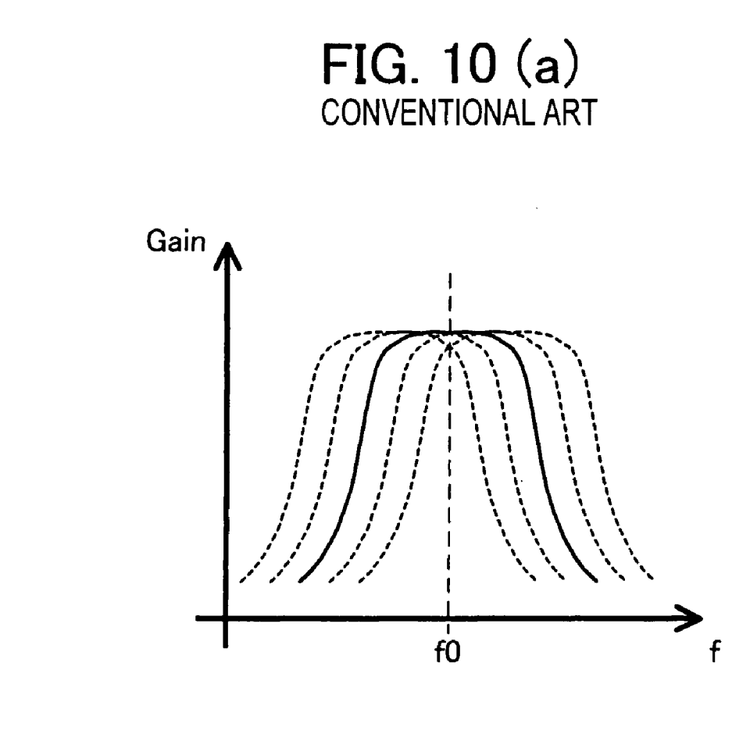
FIGS. 10(a) and 10(b) are graphs showing characteristics of a BPF, illustrating the offset of the amplifier in an FM signal receiver.

In contrast, when the amplifier 7 has an offset, the ideal characteristics of the frequency-demodulation circuit should be controlled as represented by the dash-dot line in FIG. 9(b), and those of the BPF 4 by the dash-dot line in FIG. 10(b). However, in actuality, the frequency-demodulation circuit 5 is controlled to have characteristics as represented by the solid line in FIG. 9(b), and the BPF 4 is accordingly controlled to have characteristics as represented by the solid line in FIG. 10(b).

Controlling the characteristics of the frequency-demodulation circuit 5 so that they are represented by the solid line in FIG. 9(b) does not cause serious problems. Meanwhile, controlling the BPF 4 so that they are represented by the solid line in FIG. 10(b) results in degradation in reception characteristics which is due to degradation of the reception signal and insufficient damping of signals in the adjacent channel. These are serious problems.

SUMMARY OF THE INVENTION

The present invention has an objective to provide an FM signal receiver and a wireless communications device using the same which is capable, in adjusting the BPF in reference to the characteristics of the frequency-demodulation circuit, of nullifying the effects of an offset of an amplifier which occurs between the frequency-demodulation circuit and the control circuit and suitably adjusting the BPF characteristics.

To achieve the objective, an FM signal receiver in accordance with the present invention is such that a received burst signal, after being selected by a bandpass filter and converted from frequency to voltage by a frequency-demodulation circuit, is fed via an amplifier to an analog-to-digital converter circuit in which the signal is converted to digital for demodulation; and a control circuit adjusts frequency characteristics of the bandpass filter and the frequency-demodulation circuit through an identical control signal immediately before a receiving operation, and characterized in that it includes short-circuit means between input and output terminals of the amplifier, the short-circuit means being opened during a receiving operation and shorted during an adjusting operation.

According to the arrangement, the FM signal receiver is for use in receiving a burst signals as in a Bluetooth system and includes variable frequency characteristics means, such as a phase shifter, where a bandpass filter and a frequency-demodulation circuit are constructed from similar or related circuitry so as to enable adjustment of the frequency characteristics of the bandpass filter and frequency-demodulation circuit through an identical control signal. In an adjusting operation immediately before a receiving operation, the FM signal receiver is fed with a reference signal, instead of an antenna input, and the control circuit adjusts the variable frequency characteristics means through an identical control signal in response to an output of the analog-to-digital converter circuit. Thus, the FM signal receiver is capable of carrying out a receiving operation without adjustment, by maintaining both the bandpass filter and the frequency-demodulation circuit in good state. In addition, the FM signal receiver can be integrated on a single chip.

Further, short-circuit means is provided between the input and output terminals of an amplifier which may develop a large offset compared to other circuits. The short-circuit means is opened during a receiving operation and shorted during an adjusting operation. Thus, adjustment is carried out without using the amplifier.

Therefore, when an amplifier between the frequency-demodulation circuit and the control circuit has an offset, adverse effects of the offset on the frequency-to-voltage convert by the frequency-demodulation circuit are nullified in the adjusting of the frequency-demodulation circuit and similar adjusting of the bandpass filter. Thus, the bandpass filter is prevented from being incorrectly adjusted due to the offset.

In addition, the FM signal receiver in accordance with the present invention is characterized in that the control circuit powers off the amplifier while the short-circuit means is being shorted.

According to the arrangement, during the adjusting operation carried out for every reception of a burst signal, the amplifier is powered off, enabling lower power consumption.

Another FM signal receiver in accordance with the present invention is such that a received burst signal, after being selected by a differential-type bandpass filter and converted from frequency to voltage by a differential-type frequency-demodulation circuit, is fed via a differential-input, single-output amplifier to an analog-to-digital converter circuit in which the signal is converted to digital for demodulation; and a control circuit adjusts frequency characteristics of the differential-type bandpass filter and the differential-type frequency-demodulation circuit through an identical control signal immediately before a receiving operation, and characterized in that it includes: a reference voltage source for generating a reference voltage; a switch for switching an input to the amplifier between an output signal of the differential-type frequency-demodulation circuit and the reference voltage fed from the reference voltage source; and a memory for recording an output of the analog-to-digital converter circuit, wherein the control circuit, in an adjusting operation, switches the switch to the reference voltage so as to record the output of the analog-to-digital converter circuit made in response to application of the reference voltage in the memory; and subsequently switches the switch to the frequency-demodulation circuit so as to generate the control signal based on an output value of the analog-to-digital converter circuit as recorded in the memory and adjust the frequency characteristics of the bandpass filter and the frequency-demodulation circuit through the identical control signal.

According to the arrangement, the FM signal receiver is for use in receiving a burst signals as in a Bluetooth system and includes (i) a differential-input, single-output amplifier so as to form an analog stage operating on a differential signal and eliminate the need for two or more analog-to-digital converter circuits and (ii) a bandpass filter and a frequency-demodulation circuit, each having variable frequency characteristics means, such as a phase shifter, where which is constructed from similar or related circuitry so as to enable adjustment of the frequency characteristics of the bandpass filter and frequency-demodulation circuit through an identical control signal. In an adjusting operation immediately before a receiving operation, the FM signal receiver is fed with a reference voltage from a reference voltage source, instead of an antenna input, and the control circuit adjusts the variable frequency characteristics means through an identical control signal in response to an output of the analog-to-digital converter circuit. Thus, it is possible to provide an FM signal receiver where both the bandpass filter and the frequency-demodulation circuit are capable of carrying out a receiving operation in good state without adjustment. In addition, the FM signal receiver can be integrated on a single chip.

Further, in relation to an amplifier which may develop a large offset compared to other circuits, are there provided a reference voltage source, a switch, and a memory. In an adjusting operation, the control circuit generates a control signal by: first switching the switch to the reference voltage so as to produce a zero differential input signal and record in the memory an output of the amplifier in that state as an offset; and subsequently switching the switch to the frequency-demodulation circuit so as to, for example, subtract the value recorded in the memory from the output of the analog-to-digital converter circuit based on an output value of the analog-to-digital converter circuit as recorded in the memory. The frequency characteristics of the bandpass filter and the frequency-demodulation circuit are adjusted through the identical control signal.

Therefore, adverse effects of an offset of an amplifier which occurs between the frequency-demodulation circuit and the control circuit are nullified in the adjusting of the frequency-demodulation circuit and similar adjusting of the bandpass filter. Thus, the bandpass filter is prevented from being incorrectly adjusted due to the offset.

In addition, the FM signal receiver in accordance with the present invention is characterized in that the control circuit powers off the bandpass filter and the frequency-demodulation circuit while the switch is switched to the reference voltage.

According to the arrangement, during the adjusting operation carried out for every reception of a burst signal, the bandpass filter and frequency-demodulation circuit, isolated from the amplifier, are powered off, enabling lower power consumption.

In addition, the FM signal receiver in accordance with the present invention is characterized in that it further includes a low pass filter between the frequency-demodulation circuit and the amplifier, the filter being provided with variable frequency characteristics means, frequency characteristics of the filter being controlled together through a control signal from the control circuit.

According to the arrangement, a low pass filter is disposed to damp unnecessary components in the output signal of the frequency-demodulation circuit. The low pass filter is constructed from circuitry similar or related to the bandpass filter and the frequency-demodulation circuit so that the low pass filter can be controlled similarly to the bandpass filter and frequency-demodulation circuit through the control circuit from the control signal. Thus, good reception characteristics are obtained which completely pass demodulated signal components in the output signal of the frequency-demodulation circuit and damp unnecessary components as much as possible.

In addition, the FM signal receiver in accordance with the present invention is characterized in that circuits in an analog section are complex circuits.

According to the arrangement, the reception signal and the reference signal are complex signals, the bandpass filter is a complex bandpass filter, and the frequency-demodulation circuit demodulates a complex signal.

Therefore, the bandpass filter is capable of removing the image from the entire receiver. In addition, the complex bandpass filter can be designed to damp much of the signal outside the bandwidth to form a relatively sharp edge at a cutoff frequency. Further, since the output at the output terminal of the complex signal frequency-demodulation circuit includes no component twice the frequency of the input signal, the circuitry subsequent to the frequency-demodulation circuit can be designed relatively simply. Thus, the receiver can be simplified as a whole.

A wireless communications device in accordance with the present invention includes the FM signal receiver, and is characterized in that it further includes a high frequency amplifier, a mixer, an oscillator, an analog-to-digital converter, a digital-to-analog converter, and a logic circuit, and uses the digital-to-analog converter as a reference signal generator circuit.

According to the arrangement, the wireless communications device nullifies the adverse effects of an offset of the amplifier in the adjusting. When using the digital-to-analog converter as a reference signal generator circuit, the digital-to-analog converter plays a second role as a signal generator generating a modulated signal for transmission.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
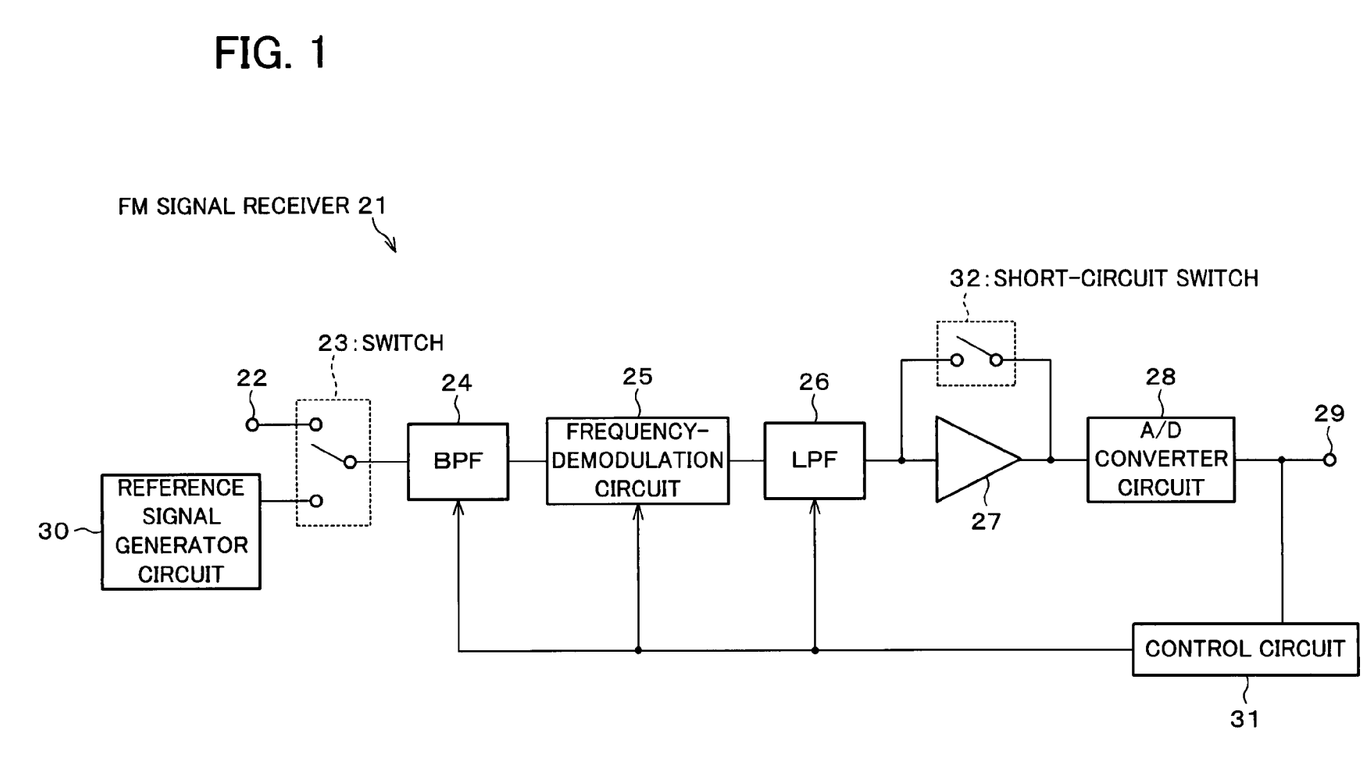
FIG. 1 is a block diagram showing an electrical construction of an FM signal receiver in accordance with a first embodiment of the present invention.

The following will describe the first embodiment of the present invention in reference to FIG. 1.

FIG. 1 is a block diagram showing an electrical construction of an FM signal receiver 21 in accordance with the first embodiment of the present invention. An FM signal received at an antenna (not shown) enters the receiver 21 through an input terminal 22 and travels past a switch 23. The signal is then filtered off by a bandpass filter (BPF) 24 to produce a signal composed of only components in the bandwidth targeted in reception. The resultant signal is fed to a frequency-demodulation circuit 25. The frequency-demodulation circuit 25 is constructed from a F-V converter circuit. The demodulated signal is filtered by a low pass filter (LPF) 26 and amplified by an amplifier 27. The signal is then converted to digital in an analog-to-digital converter circuit 28 and supplied out from an output terminal 22 to, for example, a subsequent decoder circuit (not shown).

There are also provided a reference signal generator circuit 30 and a control circuit 31 in the receiver 21 for the purposes of eliminating characteristics discrepancy due to relative precision without significantly adding circuit complexity. The circuit 30 is coupled with the switch 23. The control circuit 31 adjusts the characteristics of the BPF 24 and frequency-demodulation circuit 25. A phase shifter in the frequency-demodulation circuit 25 is constructed from circuitry similar or related to the BPF 24.

On every reception of a burst signal, like the one in Bluetooth systems, the control circuit 31 operates the switch 23 to connect the reference signal generator circuit 30 to the BPF 24 and controls the phase shifter in the frequency-demodulation circuit 25 based on the digital output of the analog-to-digital converter circuit 28 so that the output of the frequency-demodulation circuit 25 has a specified value. The circuit 31 controls the BPF 24 similarly. The switch 23 is then connected back to the input terminal 22, while the control circuit 31 maintains the characteristics of the BPF 24 and frequency-demodulation circuit 25 in the same controlled state. Thus, the control circuit 31 stabilizes the characteristics of the BPF 24 and frequency-demodulation circuit 25 in reception. By automatically adjusting the characteristics of the BPF 24 and frequency-demodulation circuit 25 in response to every reception of a burst signal in this manner, the integrated circuit becomes stable without adjustment. This mechanism is similar to that of the FM signal receiver 1 shown in FIG. 8.

Attention should be paid to the provision of a short-circuit switch 32 in the FM signal receiver 21. The switch 32 is located linking the input and output terminals of the amplifier 27 between the frequency-demodulation circuit 25 and the control circuit 31. Under the control of the control circuit 31, the switch 32 opens in a receiving operation and closes, shunting the amplifier 27, in an adjusting operation. Adjustment is therefore carried out while short-circuiting the input and output terminals of the amplifier 27 which develops a large offset compared to other circuits, that is, disabling the amplifier 27. Thus, an offset of the amplifier 27 does not adversely affect the frequency-to-voltage conversion in the frequency-demodulation circuit 25 when the circuit 25 is being adjusted. The BPF 24 is then adjusted in the same manner. This approach prevents, in the adjustment of the BPF 24 in accordance with the automatic adjustment of the characteristics of the frequency-demodulation circuit 25, the BPF 24 from being incorrectly adjusted due to the effects of the offset of the amplifier 27.

The amplifier 27 amplifies the output signal of the frequency-demodulation circuit 25 to a suitable level for the input dynamic range of the analog-to-digital converter circuit 28. With the amplifier 27 disabled during adjustment, the dynamic range of the subsequent analog-to-digital converter circuit 28 may not be fully used, resulting in imprecise adjustment. However, the frequency-demodulation circuit 25, owing to its arrangement, changes its demodulation sensitivity in response not only to the frequency, but also to the amplitude, of an input signal. Therefore, a proper increase in the amplitude of a reference signal used in adjustment compensates for a decrease in the demodulated output caused by the missing amplification. Meanwhile, the increased amplitude of the reference signal may lead to a signal distortion in the BPF 24 and other problems. These problems are however practically negligible because there are not as strict quality requirements on the reference signal during adjustment as during reception.

Attention should be paid to the fact that in the FM signal receiver 21, the LPF 26 between the frequency-demodulation circuit 25 and the amplifier 27 also includes a phase shifter constructed from circuitry similar or related to the BPF 24 and frequency-demodulation circuit 25. The frequency characteristics of this phase shifter are also controlled by a control signal from the control circuit 31. Thus, good reception characteristics are obtained which completely pass demodulated signal components in the output signal of the frequency-demodulation circuit 25 and damp unnecessary components as much as possible.

Figure 2:
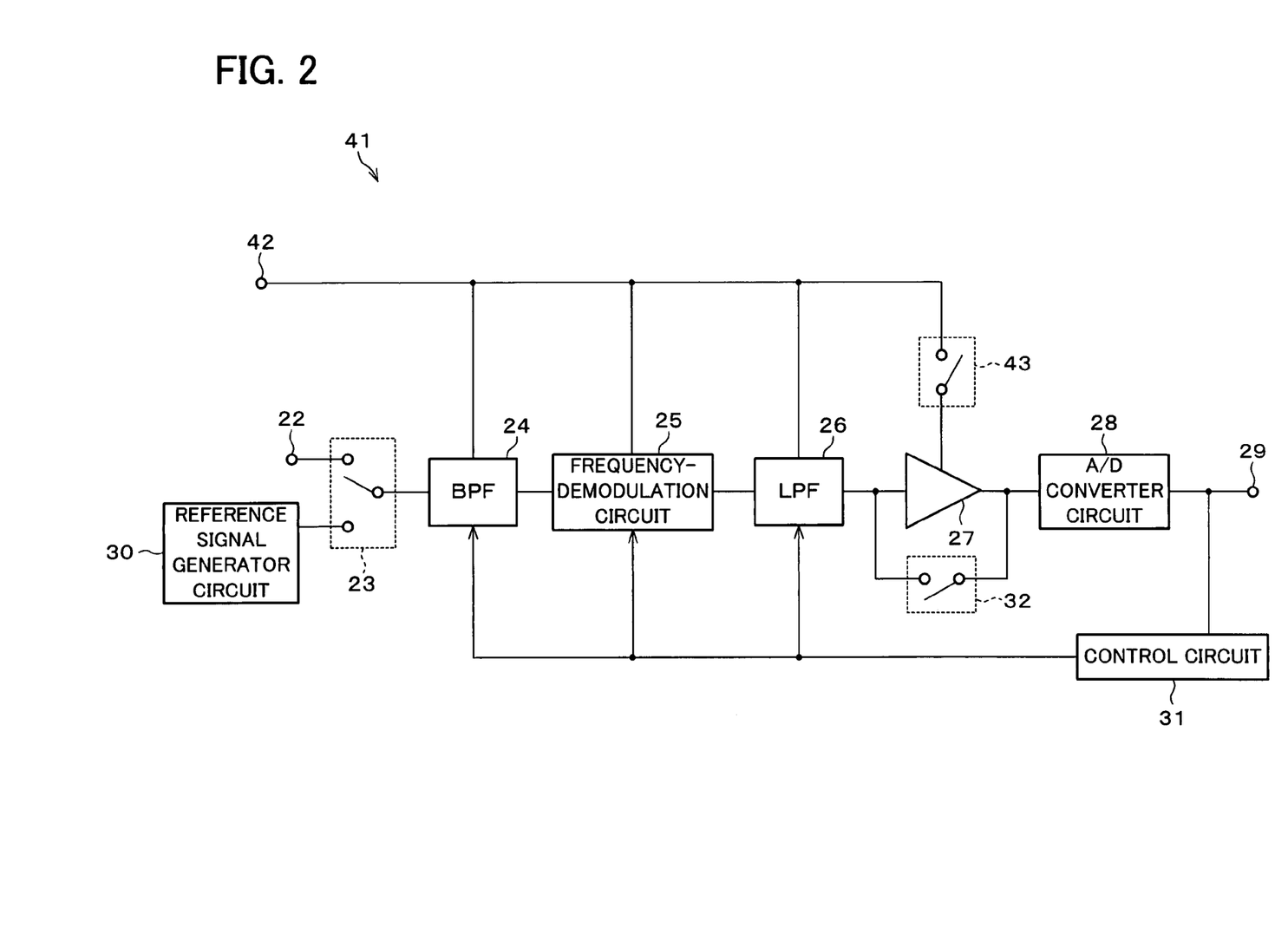
FIG. 2 is a block diagram showing an electrical construction of an FM signal receiver in accordance with a second embodiment of the present invention.

The following will describe the second embodiment of the present invention in reference to FIG. 2.

FIG. 2 is a block diagram showing an electrical construction of an FM signal receiver 41 in accordance with the second embodiment of the present invention. The FM signal receiver 41 resembles the aforementioned FM signal receiver 21. Corresponding parts are identified by the same numerals, and description thereof is omitted. Attention should be paid to the provision of a power supply switch 43 in the FM signal receiver 41. The switch 43 is disposed on a power supply line linking a power supply input terminal 42 to an amplifier 27. The opening/closing of the power supply switch 43 is controlled by a control circuit 31 similarly to a switch 23 and a short-circuit switch 32. In other words, the power supply switch 43 is in the ON position during a receiving operation during which a switch 23 is switched to an input terminal 22 and a short-circuit switch 32 is in the OFF position. The switch 43 is in the OFF position during an adjusting operation during which the switch 23 is switched to a reference signal generator circuit 30 and the short-circuit switch 32 is in the ON position.

Thus, the amplifier 27 is powered off during an adjusting operation carried out for every reception of a burst signal as described above, reducing electric consumption.

Figure 3:
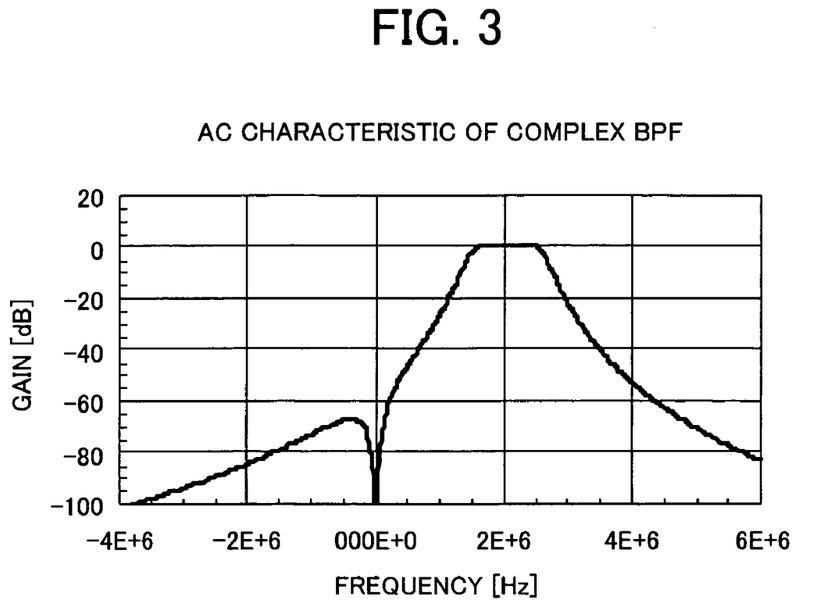
FIG. 3 is a graph showing a frequency characteristic of a complex BPF in an FM signal receiver in accordance with a third embodiment of the present invention.
Figure 4:
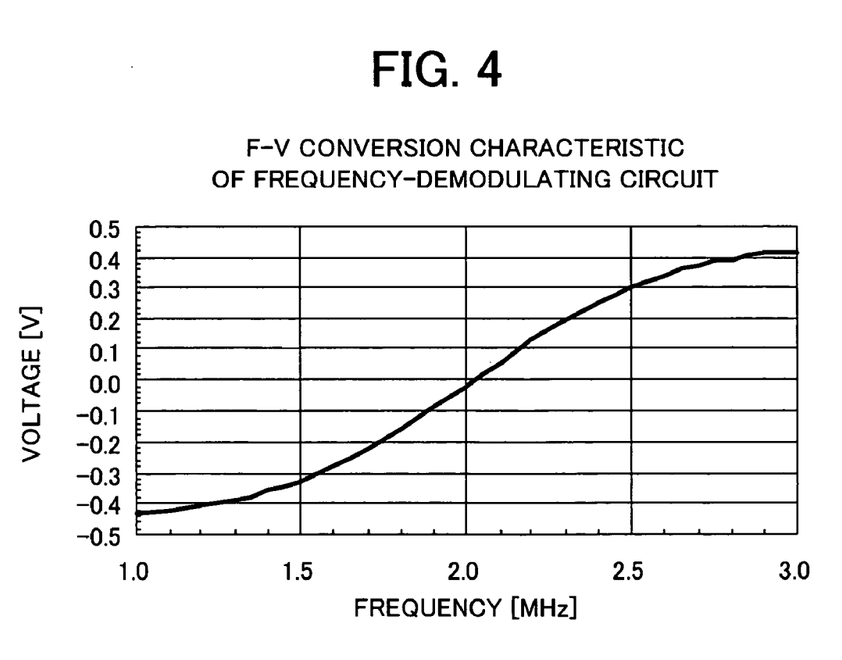
FIG. 4 is a graph showing results of simulation of the F-V conversion characteristic of a complex signal frequency-demodulation circuit in the FM signal receiver in accordance with the third embodiment of the present invention.

The following will describe the third embodiment of the present invention in reference to FIGS. 3 and 4.

In the present embodiment, a reception signal and a reference signal form a complex signal. Therefore, a reference signal generator circuit 30 generates I and Q signals differing in phase by 90 degrees from each other. Each of an input terminal 22 and a switch 23 has respective terminals for the I and Q signals. A BPF 24 and a frequency-demodulation circuit 25 are constructed from a complex BPF and a complex signal frequency-demodulation circuit as disclosed in, for example, U.S. patent application US-2002-0135418.

Since negative frequencies can be described using the I and Q signals differing by 90 degrees in phase, the complex BPF can remove the image from the entire receiver. In addition, the complex BPF can be designed to damp much of the signal outside the bandwidth to form a relatively sharp edge at a cutoff frequency. Further, since the output at the output terminal of the complex signal frequency-demodulation circuit includes no component twice the frequency of the input signal, the circuitry subsequent to the frequency-demodulation circuit 25 can be designed relatively simply. Thus, the receiver can be simplified as a whole.

FIG. 3 shows a frequency characteristic of the complex BPF. FIG. 4 shows results of simulation of the F-V conversion characteristic of the complex signal frequency-demodulation circuit. The FIG. 3 complex BPF is designed with a desired signal frequency of 2 MHz. The image signal frequency is −2 MHz. The FIG. 4 frequency-demodulation circuit is also designed with a center frequency of 2 MHz.

Figure 5:
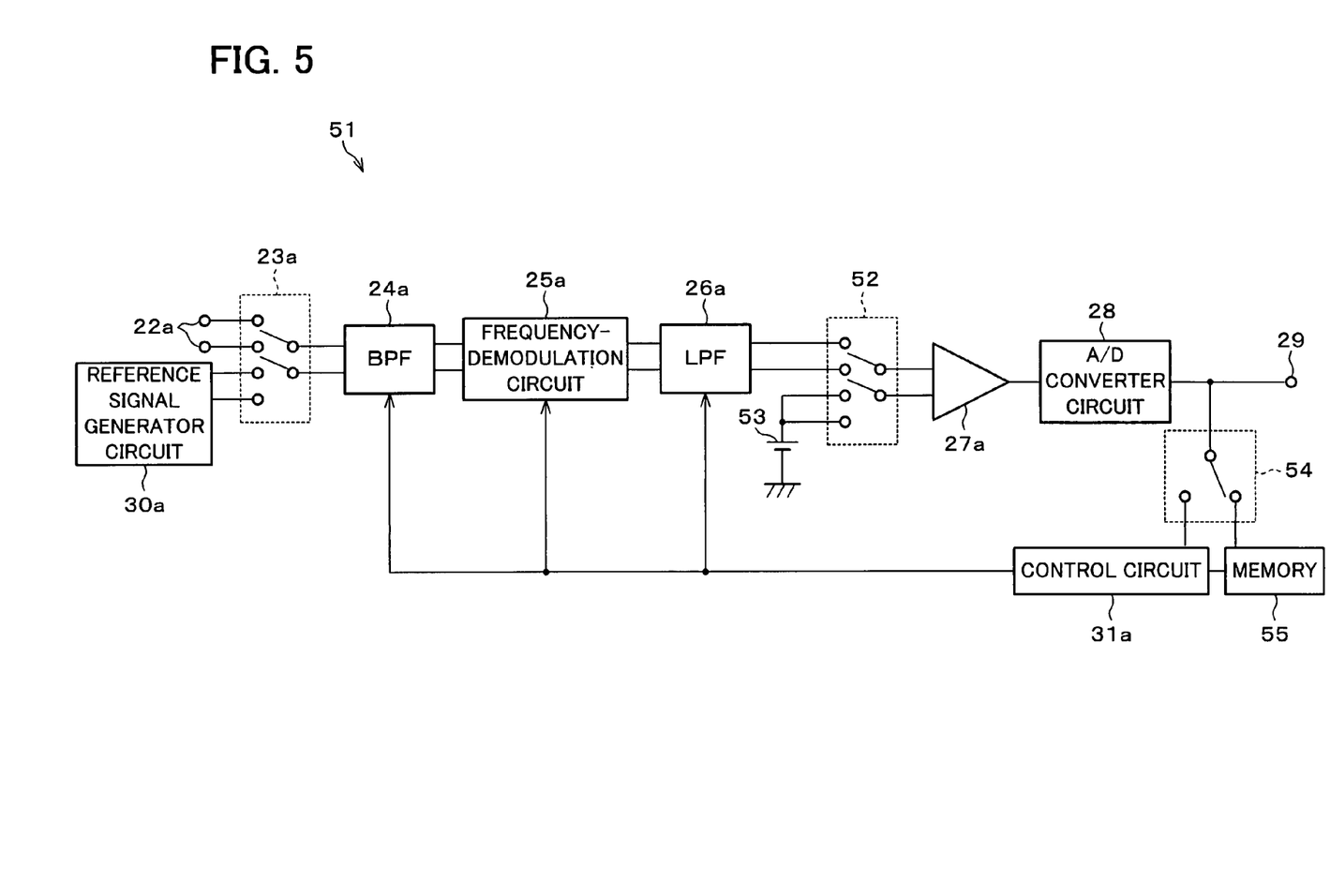
FIG. 5 is a block diagram showing an electrical construction of an FM signal receiver in accordance with a fourth embodiment of the present invention.

The following will describe the fourth embodiment of the present invention in reference to FIG. 5.

FIG. 5 is a block diagram showing an electrical construction of an FM signal receiver 51 in accordance with the fourth embodiment of the present invention. The FM signal receiver 51 resembles the aforementioned FM signal receiver 21. Corresponding parts are identified by the same numerals, and description thereof is omitted. Attention should be paid to the fact that whereas the aforementioned FM signal receivers 21, 41 operate on a single input, the FM signal receiver 51 operates on a differential signal in the analog stage. An incoming differential signal enters the receiver 51 through input terminals 22a and travels past a switch 23a. The signal is then filtered off by a differential-type bandpass filter (BPF) 24a to produce a signal composed of only components in the bandwidth targeted in reception. The resultant signal is fed to a differential-type frequency-demodulation circuit 25a. The output of the frequency-demodulation circuit 25a travels past a differential-type low pass filter (LPF) 26a and a switch 52 before being fed to an amplifier 27a which operates on a differential input to produce a single output.

Thus, although the analog stage operates on a differential signal, the amplifier 27a produces a single output, eliminating the need for provision of another highly complex analog-to-digital converter circuit 28. The embodiment can handle a differential signal without significantly adding circuit complexity.

The FM signal receiver 51 is further provided with a reference voltage source 53, the switch 52, a switch 54, and a memory 55 in association with the amplifier 27a which may develop a large offset compared to other circuits. The reference voltage source 53 generates a predetermined constant voltage and feeds it to both differential inputs of the amplifier 27a via the switch 52 capable of switching on/off a differential signal. Under these circumstances, at the single output terminal of the amplifier 27a does appear an offset voltage of the amplifier 27a. The switch 54 switches the output path for the analog-to-digital converter circuit 28. The memory 55 holds an output signal, of the analog-to-digital converter circuit 28, which corresponds to an offset of the amplifier 27a.

In the FM signal receiver 41, a control circuit 31a, in an adjusting operation, positions the switch 52 to connect to the reference voltage source 53 to provide a 0 differential input signal, and then records in the memory 55 the output of the analog-to-digital converter circuit 28 in that state, the output signal corresponding to the offset of the amplifier 27a. Next, the circuit 31a positions the switch 52 to connect to the frequency-demodulation circuit 25a and the switch 23a to connect to a reference signal generator circuit 30a to provide a reference signal, so as to adjust the frequency-demodulation circuit 25a. In this state, the amplifier 27a outputs a sum of a demodulated signal and the offset. The sum output is converted into digital by the analog-to-digital converter circuit 28 and fed to the control circuit 31a. Accordingly, the control circuit 31a utilizes the value recorded in the memory 55 to produce the control signal for the output of the analog-to-digital converter circuit 28. The control signal is generated by, for example, subtracting the value recorded in the memory 55 from the output of the analog-to-digital converter circuit 28. The same control signal is used to adjust the frequency characteristics of the BPF 24a and LPF 26a. To receive a frequency modulated signal, the switch 23a is positioned to connect to the input terminals 22a, and the switch 52 is positioned to connect to the LPF 26a. The control circuit 31a maintains the adjusted state for the control signal.

Thus, the embodiment, designed to handle differential signals, is free from adverse effects of the offset of the amplifier 27a which occur between the frequency-demodulation circuit 25a and the control circuit 31a to adjust the frequency-demodulation circuit 25a, preventing the BPF 24a from being incorrectly adjusted. In this differential signal handling design, the receiver can be simplified as a whole by the use of the complex signal, complex BPF, and complex frequency-demodulation circuit as described earlier.

Figure 6:
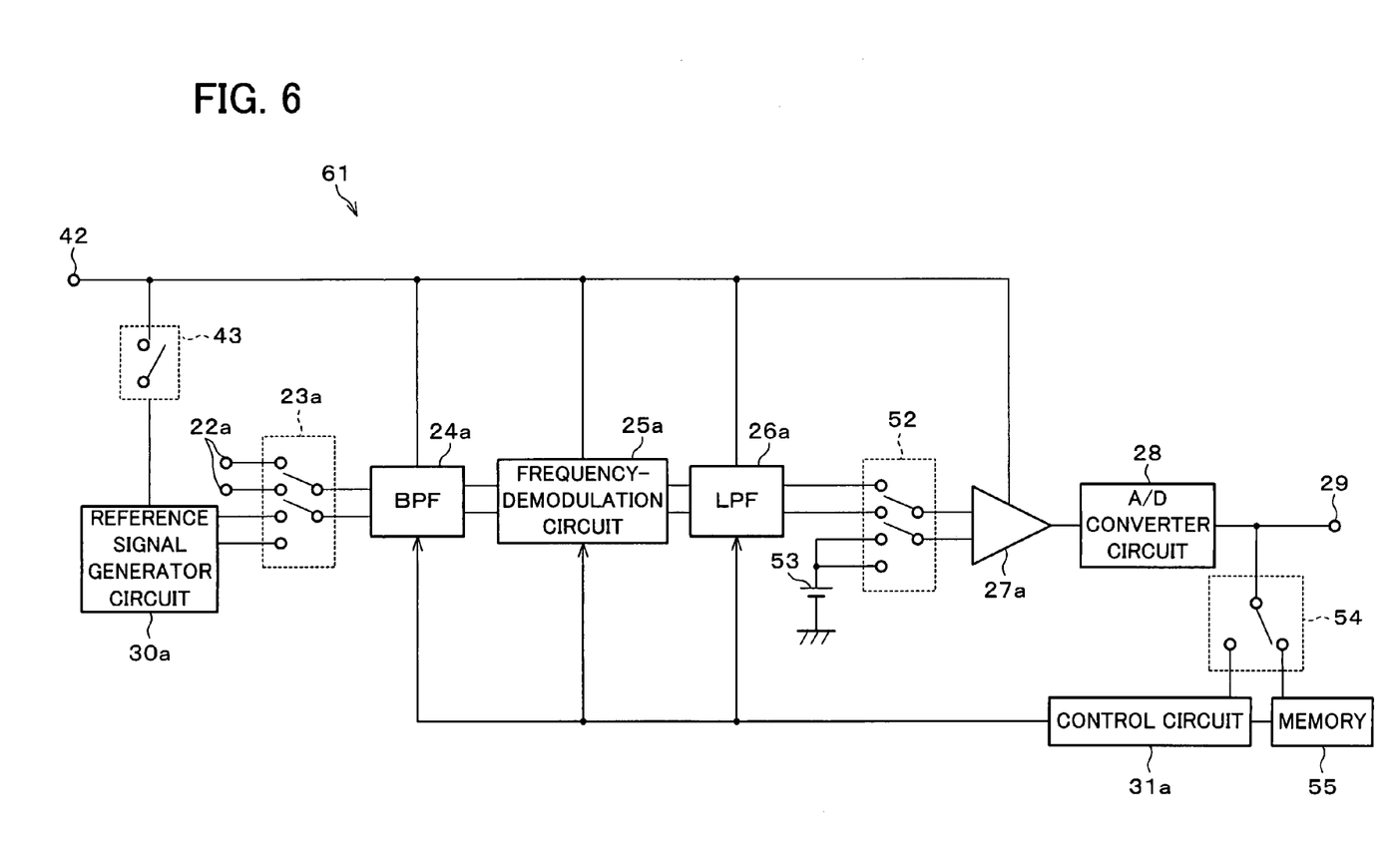
FIG. 6 is a block diagram showing an electrical construction of an FM signal receiver in accordance with a fifth embodiment of the present invention.

The following will describe the fifth embodiment of the present invention in reference to FIG. 6.

FIG. 6 is a block diagram showing an electrical construction of an FM signal receiver 61 in accordance with the fifth embodiment of the present invention. The FM signal receiver 61 resembles the FM signal receivers 41, 61. That is, in the FM signal receiver 41 handling a differential signal, a power supply switch 43 is provided on power supply lines to the reference signal generator circuit 30a, a BPF 24a, an LPF 26a, and a frequency-demodulation circuit 25a. The control circuit 31a positions the switch 52 to connect to the reference voltage source 53. While these circuits are not in use, power supply to the circuits is cut off. In this manner, current consumption can also be reduced in an adjustment period.

Figure 7:
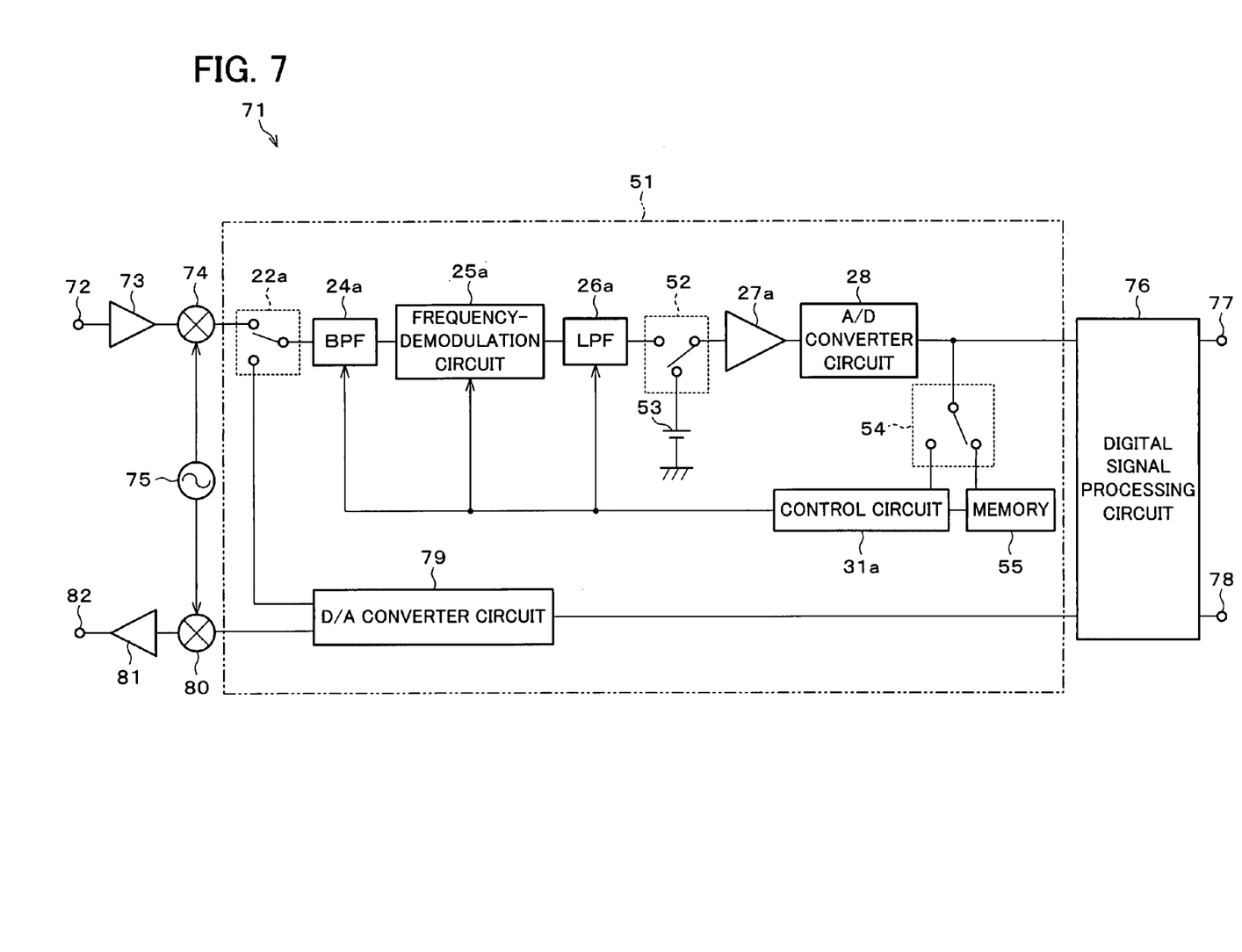
FIG. 7 is a block diagram showing an electrical construction of a wireless communications device in accordance with a sixth embodiment of the present invention.

The following will describe the sixth embodiment of the present invention in reference to FIG. 7.

FIG. 7 is a block diagram showing an electrical construction of a wireless communications device 71 in accordance with the sixth embodiment of the present invention. In FIG. 5, the wireless communications device 71 may be built from the FM signal receiver 51. Alternatively, the device 71 may be built from one of the FM signal receivers 21, 41, 61.

A high frequency reception signal entering through an input terminal 72 is amplified by a high frequency amplifier 73 and mixed with a local signal from an oscillator 75 in a mixer circuit 74. The signal is then rid of the carrier component to retain only frequency modulated components before being passed through the switch 22a. A digital signal from the analog-to-digital converter circuit 28 is fed to a digital signal processing circuit 76 for signal processing, and output to a received data output terminal 77.

Meanwhile, transmission data entering through a transmission data input terminal 78 is processed by the digital signal processing circuit 76 and fed to a digital-to-analog converter circuit 79 to produce a signal the frequency of which varies in accordance with the result of the processing in the digital signal processing circuit 76. This signal from the digital-to-analog converter circuit 79 is mixed with a carrier signal from the oscillator 75 in a mixer circuit 80, so as to produce an FSK signal to be transmitted. The FSK signal is amplified by a high frequency amplifier 81 and output to the antenna via the output terminal 82.

FIG. 7 shows a single input for simple illustration. In actuality, the analog stage operates on differential inputs as shown in FIG. 5 described above. Specifically, at the receiving end, the analog stage operates on a differential signal beginning at the output of the high frequency amplifier 73 and ending at the input of the amplifier 27a. At the transmitting end, the analog stage operates on a differential signal beginning at the digital-to-analog converter circuit 79 and ending at the input of the high frequency amplifier 81, as well as the signal from the local signal generator 75.

In this manner, in adjusting the BPF 24a in accordance with the automatic adjustment of the characteristics of the frequency-demodulation circuit 25a, the wireless communications device 71 to which is mounted the FM signal receiver 41 is capable of preventing the BPF 24a from being incorrectly adjusted due to effects of the offset of the amplifier 27a.

The digital-to-analog converter circuit 79 converts an input signal from the digital signal processing circuit 76 to an analog signal to supply the analog signal to the transmitting-end mixer 80 as described earlier. When adjusting the BPF 24a, frequency-demodulation circuit 25a, and LPF 26a, there is no need to supply a signal to the transmitting-end mixer 80; therefore, in this wireless communications device 71, when adjusting these circuits, the circuit 79 plays a second role as a reference signal generator circuit 30a generating a reference signal. This eliminates the need to provide a dedicated reference signal generator circuit 30a, and makes it possible to avoid adding significant circuit complexity.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An FM signal receiver, comprising:
   a bandpass filter for selecting a received burst signal;
   a frequency-demodulation circuit for converting the burst signal selected by the bandpass filter from a frequency to a voltage;
   an amplifier for amplifying the burst signal converted from the frequency to the voltage by the frequency-demodulation circuit;
   an analog-to-digital converter circuit for converting to digital the burst signal fed via the amplifier for demodulation;
   a control circuit for adjusting frequency characteristics of the bandpass filter and the frequency-demodulation circuit through an identical control signal immediately before a receiving operation; and
   a shorting circuit provided between input and output terminals of the amplifier, the shorting circuit being opened during the receiving operation and shorted during an adjusting operation.

2. The FM signal receiver as set forth in claim 1, wherein the control circuit powers off the amplifier while the shorting circuit is being shorted.

3. The FM signal receiver as set forth in claim 1, further comprising a reference signal generator circuit for outputting, in the adjusting operation immediately before the receiving operation, a reference signal, instead of the burst signal, to the bandpass filter.

4. The FM signal receiver as set forth in claim 1, further comprising a low pass filter between the frequency-demodulation circuit and the amplifier, the low pass filter being provided with a variable frequency characteristics circuit, frequency characteristics of the low pass filter being controlled together through the control signal from the control circuit.

5. The FM signal receiver as set forth in claim 1, wherein circuits in an analog section are complex circuits.

6. The FM signal receiver as set forth in claim 5, further comprising a reference signal generator circuit for outputting a reference signal, instead of the burst signal, to the bandpass filter in the adjusting operation immediately before the receiving operation,
   wherein the burst signal and the reference signal are complex signals, the bandpass filter is a complex bandpass filter, and the frequency-demodulation circuit demodulates a complex signal.

7. An FM signal receiver, comprising:
   a differential-type bandpass filter for selecting a received burst signal;
   a differential-type frequency-demodulation circuit for converting the burst signal selected by the bandpass filter from a frequency to a voltage;
   a differential-input, single-output amplifier for amplifying the burst signal converted from the frequency to the voltage by the frequency-demodulation circuit;
   an analog-to-digital converter circuit for converting to digital the burst signal fed via the amplifier for demodulation;
   a control circuit for adjusting frequency characteristics of the differential-type bandpass filter and the differential-type frequency-demodulation circuit through an identical control signal immediately before a receiving operation;
   a reference voltage source for generating a reference voltage;
   a switch for switching an input to the amplifier between an output signal of the differential-type frequency-demodulation circuit and the reference voltage fed from the reference voltage source; and
   a memory for recording an output of the analog-to-digital converter circuit,
   wherein the control circuit, in an adjusting operation, switches the switch to the reference voltage so as to record the output of the analog-to-digital converter circuit made in response to application of the reference voltage in the memory; and subsequently switches the switch to the frequency-demodulation circuit so as to generate the control signal based on the output value of the analog-to-digital converter circuit as recorded in the memory and adjust the frequency characteristics of the bandpass filter and the frequency-demodulation circuit through the identical control signal.

8. The FM signal receiver as set forth in claim 7, wherein the control circuit, in the adjusting operation, generates a control signal by: first switching the switch to the reference voltage so as to produce a zero differential input signal and record in the memory the output of the analog-to-digital converter circuit which is a signal representing an offset of the amplifier in that state; and subsequently switching the switch to the frequency-demodulation circuit and switching an input to the bandpass filter to a reference signal generator circuit to input a reference signal and subtract the value recorded in the memory from the output of the analog-to-digital converter circuit.

9. The FM signal receiver as set forth in claim 7, further comprising a reference signal generator circuit for outputting, in the adjusting operation immediately before the receiving operation, a reference signal, instead of the burst signal, to the bandpass filter.

10. The FM signal receiver as set forth in claim 7, wherein the control circuit powers off the bandpass filter and the frequency-demodulation circuit while the switch is switched to the reference voltage.

11. The FM signal receiver as set forth in claim 7, further comprising a low pass filter between the frequency-demodulation circuit and the amplifier, the low pass filter being provided with a variable frequency characteristics circuit, frequency characteristics of the low pass filter being controlled together through the control signal from the control circuit.

12. The FM signal receiver as set forth in claim 7, wherein circuits in an analog section are complex circuits.

13. The FM signal receiver as set forth in claim 12, further comprising a reference signal generator circuit for outputting a reference signal, instead of the burst signal, to the bandpass filter in the adjusting operation immediately before the receiving operation,
wherein the burst signal and the reference signal are complex signals, the bandpass filter is a complex bandpass filter, and the frequency-demodulation circuit demodulates a complex signal.

14. A wireless communications device, including an FM signal receiver comprising:
a bandpass filter for selecting a received burst signal;
a frequency-demodulation circuit for converting the burst signal selected by the bandpass filter from a frequency to a voltage;
an amplifier for amplifying the burst signal converted from the frequency to the voltage by the frequency-demodulation circuit;
an analog-to-digital converter circuit for converting to digital the burst signal fed via the amplifier for demodulation;
a control circuit for adjusting frequency characteristics of the bandpass filter and the frequency-demodulation circuit through an identical control signal immediately before a receiving operation; and
a shorting circuit provided between input and output terminals of the amplifier, the shorting circuit being opened during the receiving operation and shorted during an adjusting operation,
wherein said wireless communications device further includes a high frequency amplifier, a mixer, an oscillator, an analog-to-digital converter, a digital-to-analog converter, and a logic circuit, and uses the digital-to-analog converter as a reference signal generator circuit.

15. A wireless communications device, including an FM signal receiver comprising:
a differential-type bandpass filter for selecting a received burst signal;
a differential-type frequency-demodulation circuit for converting the burst signal selected by the bandpass filter from a frequency to a voltage;
a differential-input, single-output amplifier for amplifying the burst signal converted from the frequency to the voltage by the frequency-demodulation circuit;
an analog-to-digital converter circuit for converting to digital the burst signal fed via the amplifier for demodulation;
a control circuit for adjusting frequency characteristics of the differential-type bandpass filter and the differential-type frequency-demodulation circuit through an identical control signal immediately before a receiving operation;
a reference voltage source for generating a reference voltage;
a switch for switching an input to the amplifier between an output signal of the differential-type frequency-demodulation circuit and the reference voltage fed from the reference voltage source; and
a memory for recording an output of the analog-to-digital converter circuit,
wherein the control circuit, in an adjusting operation, switches the switch to the reference voltage so as to record the output of the analog-to-digital converter circuit made in response to application of the reference voltage in the memory; and subsequently switches the switch to the frequency-demodulation circuit so as to generate the control signal based on the output value of the analog-to-digital converter circuit as recorded in the memory and adjust the frequency characteristics of the bandpass filter and the frequency-demodulation circuit through the identical control signal,
wherein said wireless communications device further includes a high frequency amplifier, a mixer, an oscillator, an analog-to-digital converter, a digital-to-analog converter, and a logic circuit, and uses the digital-to-analog converter as a reference signal generator circuit.

* * * * *